United States Patent
Chang

(10) Patent No.: US 8,272,606 B2
(45) Date of Patent: Sep. 25, 2012

(54) MOUNTING APPARATUS FOR DATA STORAGE DEVICE

(75) Inventor: Chin-Ming Chang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 220 days.

(21) Appl. No.: 12/905,435

(22) Filed: Oct. 15, 2010

(65) Prior Publication Data

US 2012/0037769 A1   Feb. 16, 2012

(30) Foreign Application Priority Data

Aug. 16, 2010   (TW) .............................. 99127368 A

(51) Int. Cl.
*F16L 3/08* (2006.01)
*H05K 7/20* (2006.01)
*H02H 7/04* (2006.01)

(52) U.S. Cl. ......... 248/222.11; 248/225.11; 361/679.33; 361/679.37; 361/679.57; 312/223.2

(58) Field of Classification Search ............. 248/222.11, 248/225.11, 27.1, 611, 612; 361/679.33, 361/679.37, 679.39, 679.57, 679.59, 685, 361/724–727; 312/223.1, 223.2, 333
See application file for complete search history.

(56) References Cited

U.S. PATENT DOCUMENTS

| 6,646,871 | B1 * | 11/2003 | Liao et al. ................. 312/223.2 |
| 6,813,148 | B2 * | 11/2004 | Hsu et al. ................. 361/679.39 |
| 7,035,099 | B2 * | 4/2006 | Wu .......................... 248/222.11 |
| 7,760,495 | B2 * | 7/2010 | Li ............................. 361/679.37 |
| 8,009,416 | B2 * | 8/2011 | Kang ....................... 361/679.38 |
| 8,072,745 | B2 * | 12/2011 | Chen et al. .............. 361/679.33 |
| 2005/0066346 | A1 * | 3/2005 | Wang et al. ................... 361/685 |
| 2005/0195564 | A1 * | 9/2005 | Peng et al. ..................... 361/685 |
| 2006/0034048 | A1 * | 2/2006 | Xu ................................ 361/685 |
| 2008/0128579 | A1 * | 6/2008 | Chen et al. ................... 248/694 |

* cited by examiner

*Primary Examiner* — Tan Le
(74) *Attorney, Agent, or Firm* — Altis Law Group, Inc.

(57) ABSTRACT

A mounting apparatus for mounting a data storage device includes a bracket, a mounting member fixed to the data storage device, a locking member movably attached to the bracket, and a resilient member arranged between the locking member and the bracket. The bracket defines a slide slot. The mounting member forms a post at an outer surface to slide in the slide slot. The locking member forms a protrusion with an inclined surface and a stop surface. The post of the mounting member can ride over the inclined surface of the locking member to be limited by the stop surface.

9 Claims, 4 Drawing Sheets

MOUNTING APPARATUS FOR DATA STORAGE DEVICE

BACKGROUND

1. Technical Field

The present disclosure relates to mounting apparatuses and, more particularly, to a mounting apparatus for a data storage device.

2. Description of Related Art

An electronic apparatus, such as a computer or a server, usually includes data storage devices, such as hard disk drives, compact disk read-only memory (CD-ROM) drives, digital video disk (DVD) drives, and floppy disk drives. These devices are typically added to increase the functionality of the electronic apparatus as desired by a user. However, the installation of such devices in the electronic apparatus is usually labor-intensive. The installation of a hard disk drive in a computer typically involves using screws to attach the hard disk drive to a bracket in a chassis of the computer. Usually, these screws are so small and are difficult to be installed. It is laborious and time-consuming to manipulate the screws.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
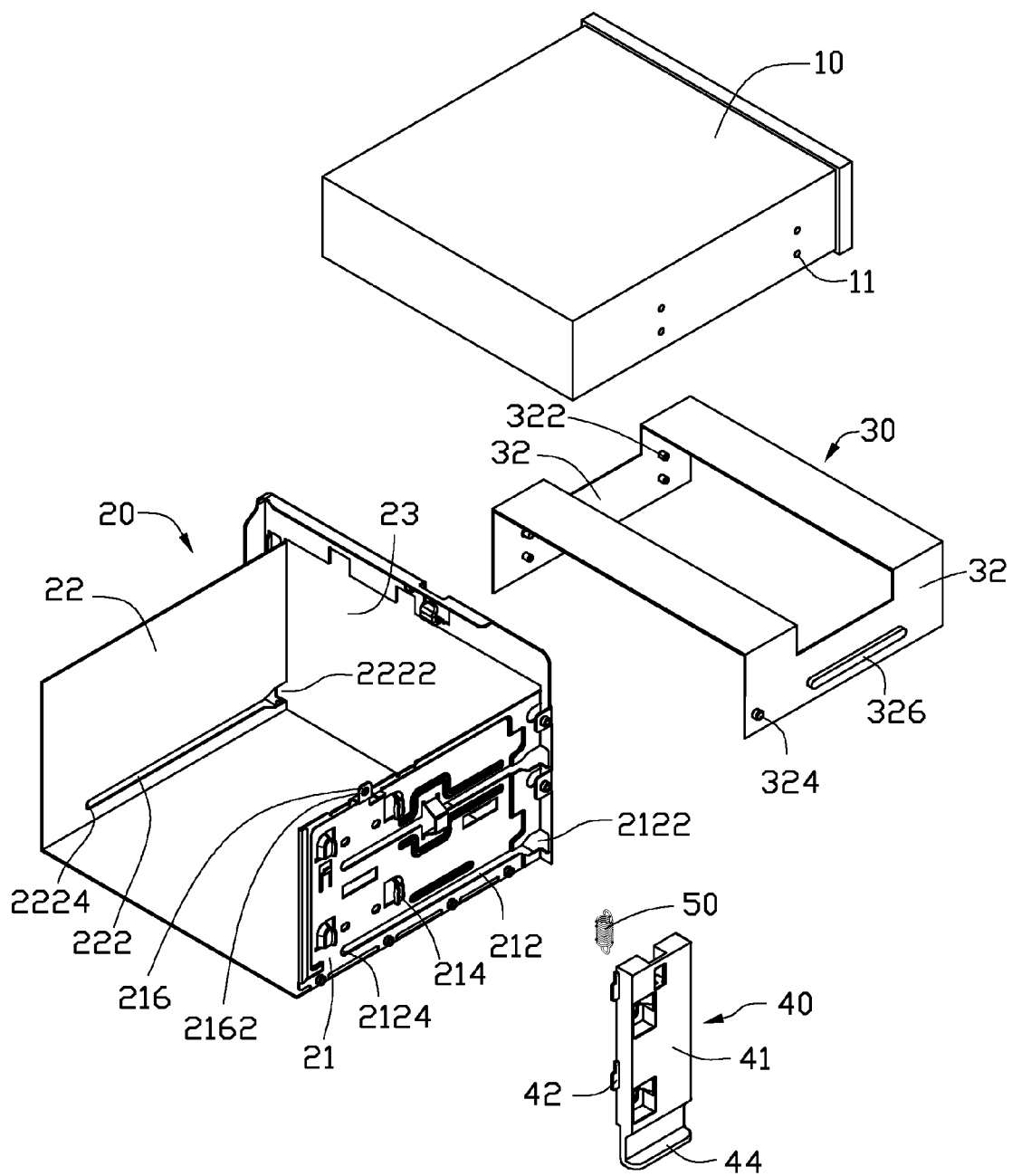
FIG. 1 is an exploded, isometric view of an embodiment of a mounting apparatus for a data storage device, the mounting apparatus includes a locking member.

Referring to FIG. 1, an embodiment of a mounting apparatus is provided to mount a data storage device 10, such as a hard disk drive. The mounting apparatus includes a bracket 20, a mounting member 30, a locking member 40, and a resilient member 50. In this embodiment, the resilient member 50 is a coil spring. Each of two opposite sides of the data storage device 10 defines a number of mounting holes 11.

The bracket 20 includes a first sidewall 21 and a second sidewall 22 parallel to the first sidewall 21. An opening 23 is defined in an end of the bracket 20, between the first and second sidewalls 21 and 22. The first sidewall 21 defines a horizontal slide slot 212. The slide slot 212 includes an opening end 2122 communicating with the opening 23, and a closed end 2124 opposite to the opening end 2122. A number of positioning portions 214 with L-shaped cross section are formed on an outer surface of the first sidewall 21 of the bracket 20. The first sidewall 21 forms a locking piece 216 above the positioning portions 214. The locking piece 216 defines a locking hole 2162. The second sidewall 22 defines a horizontal slide slot 222 opposite to the slide slot 212 of the first sidewall 21. The slide slot 222 includes an opening end 2222 communicating with the opening 23, and a closed end 2224 opposite to the opening end 2222.

The mounting member 30 is substantially U-shaped, and includes two parallel side plates 32. Each side plate 32 forms a number of pins 322 on an inner surface, corresponding to the mounting holes 11 of the data storage device 10. A horizontal elongated raised portion 326 and a post 324 aligned with the raised portion 326 are formed on a lower portion of an outer surface of each side plate 32. The mounting member 30 is made of elastic material.

Figure 2:
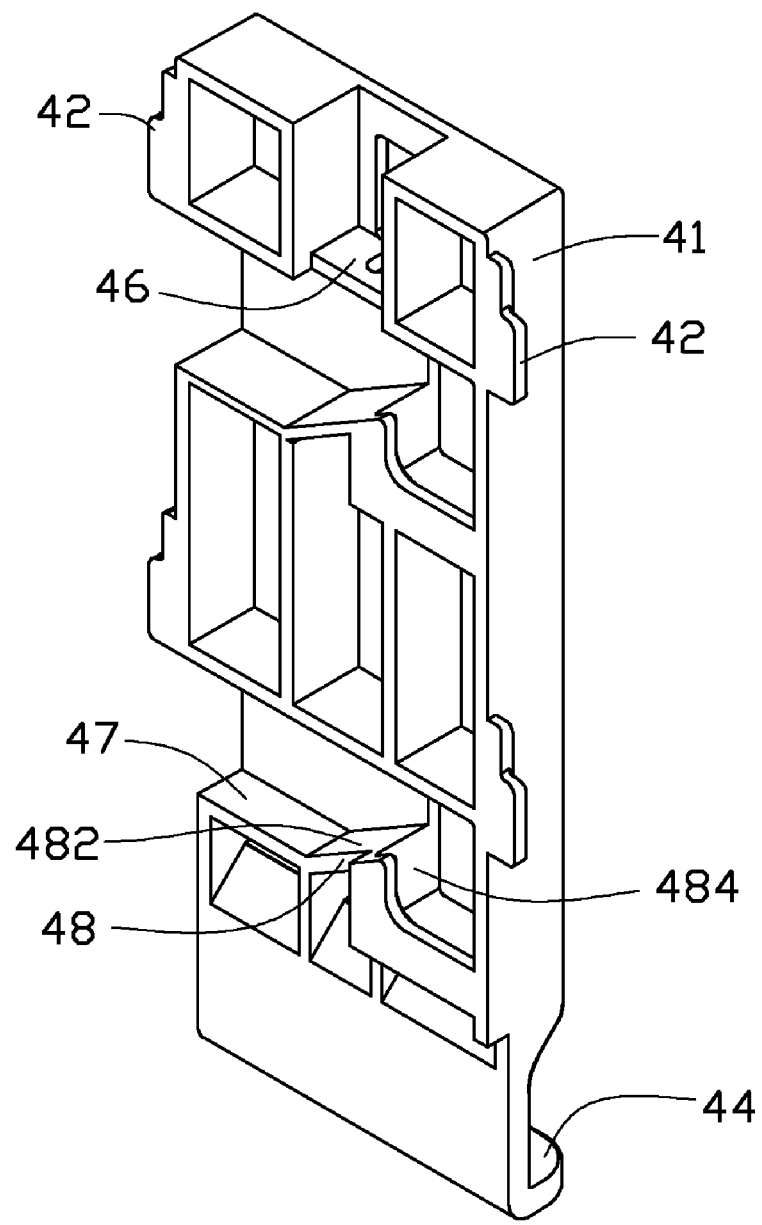
FIG. 2 is an enlarged view of the locking member of FIG. 1, but viewed from another perspective.

Referring to FIG. 2, the locking member 40 includes a substantially rectangular-shaped main body 41. A number of positioning pieces 42 extend outward from opposite sides of the main body 41. A handle 44 perpendicularly extends from a bottom of the main body 41. A hooking portion 46 is formed on an upper portion of an inner surface of the main body 41, opposite to the handle 44. A horizontal slot 47 is defined in a lower portion of the inner surface of the main body 41. A protrusion 48 is formed in the slot 47. The protrusion 48 includes an inclined surface 482 facing a first end of the slot 47, and a stop surface 484 opposite to the inclined surface 482.

Figure 3:
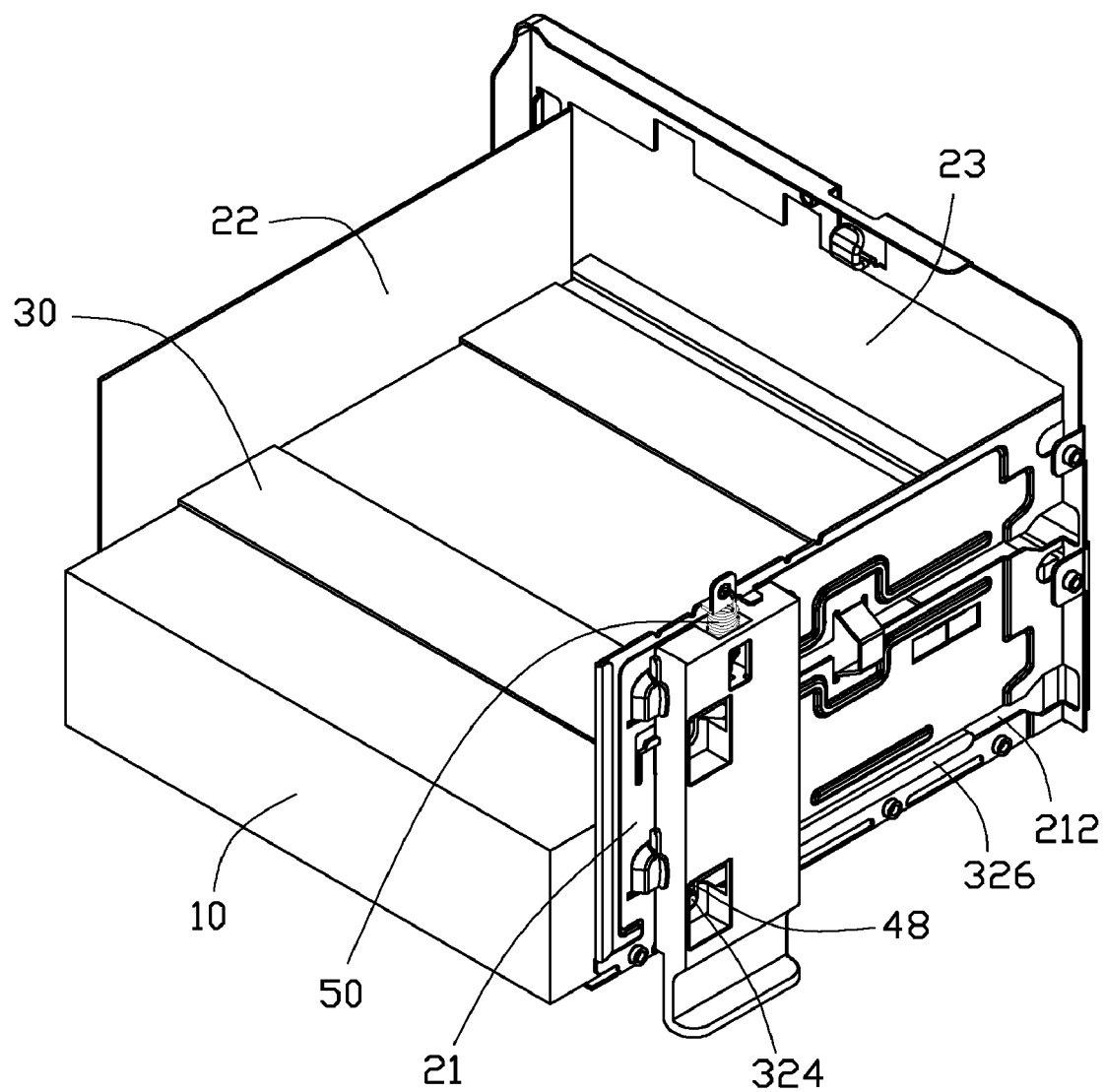
FIG. 3 is an assembled, isometric view of FIG. 1.

Referring to FIG. 3, in assembly, the positioning pieces 42 of the locking member 40 are positioned under the corresponding positioning portions 214 of the first sidewall 21. Two ends of the resilient member 50 are locked to the hooking portion 46 of the locking member 40 and the locking hole 2162 of the locking piece 216 of the first sidewall 21.

To mount the data storage device 10 to the bracket 20, the side plates 32 of the mounting member 30 are spread to sandwich the data storage device 10, with the pins 322 plugging into the corresponding mounting holes 11 of the data storage device 10. The data storage device 10 including the attached mounting member 30 is inserted in the bracket 20 through the opening 23. The posts 324 of the mounting member 30 slide into the slide slots 212 and 222 through the opening ends 2122 and 2222, respectively. The post 324 corresponding to the first sidewall 21 presses against the inclined surface 482 of the locking member 40 to move down the locking member 40 and deform the resilient member 50. After the post 324 rides over the protrusion 48, the resilient member 50 restores to move up the locking member 40 to position the post 324 between the stop surface 484 of the locking member 40 and the closed end 2124 of the slide slot 212. The raised portions 326 of the mounting member 30 are set in the slide slots 212 and 222 to limit the mounting member 30. Obviously, the raised portions 326 of the mounting member 30 may be substituted by posts, same as the posts 324 for example, formed on the outer surfaces of the side plates 32 and aligned with the corresponding posts 324.

Figure 4:
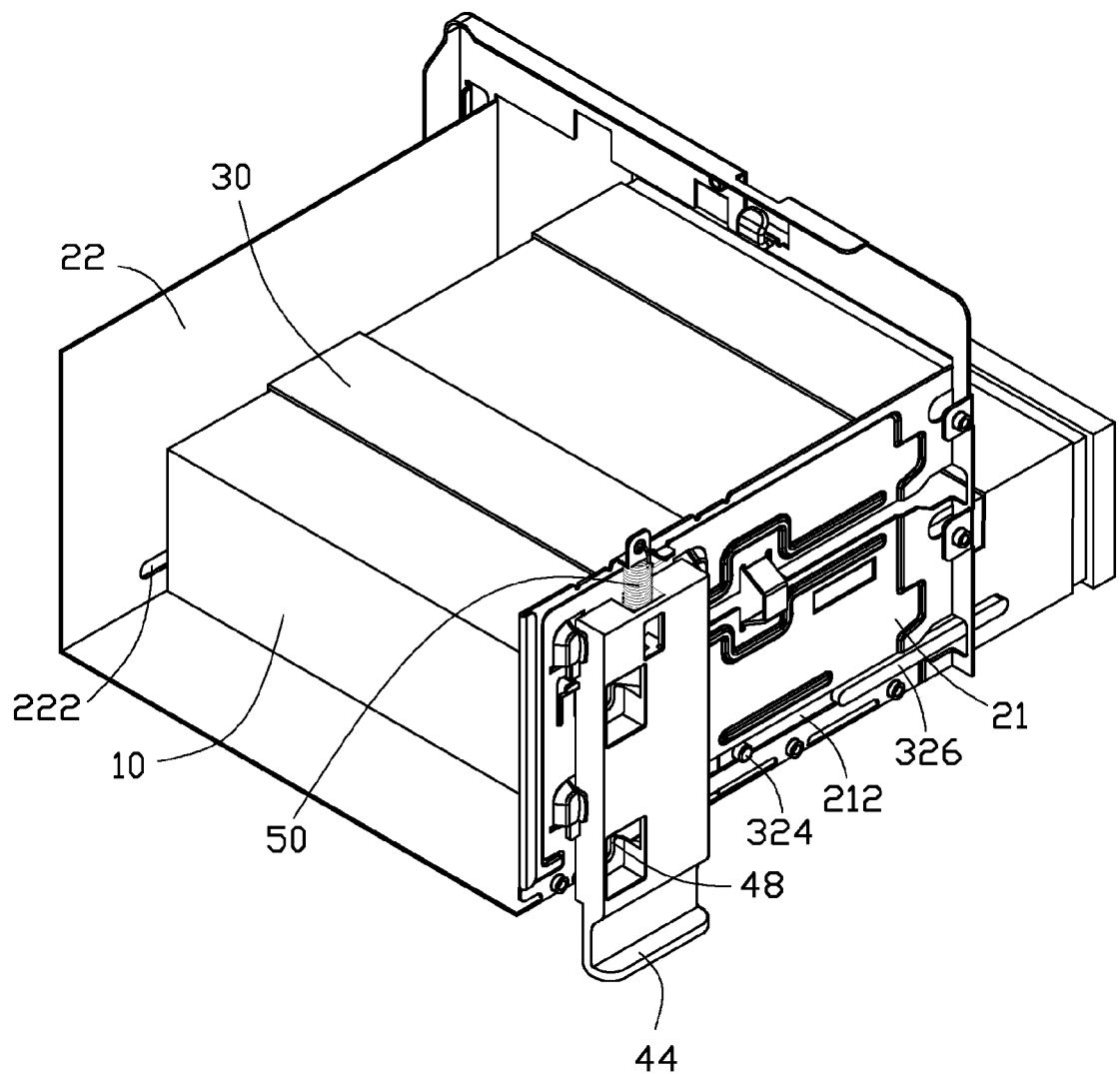
FIG. 4 is similar to FIG. 3, but showing an unlocked using state.

Referring to FIG. 4, to detach the data storage device 10 from the bracket 20, the handle 44 of the locking member 40 is pulled down to move down the locking member 40 and deform the resilient member 50 until the stop surface 484 of the locking member 40 disengages from the post 324 of the mounting member 30. Thus, the data storage device 10 and the mounting member 30 can slide out of the bracket 20.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A mounting apparatus for mounting a data storage device with a plurality of mounting holes defined in opposite sides, the mounting apparatus comprising:
    a bracket comprising a first sidewall, the first sidewall defining a first slide slot with a closed end;
    a mounting member comprising two side plates, a plurality of rods formed at an inner surface of each of the side plate for being engaged in the mounting holes of the data storage device to mount the data storage device in the mounting member, a first post formed at an outer surface of one of the side plates;
    a locking member arranged on the first sidewall of the bracket, the locking member comprising an inclined surface and a stop surface; and
    a resilient member, opposite ends of the resilient member locked to the locking member and the first sidewall respectively;
    wherein the first post of the mounting member slides in the first slide slot of the first sidewall of the bracket to press against the inclined surface of the locking member to move the locking member until the first post is limited between the stop surface of the locking member and the closed end of the first slide slot of the bracket.

2. The mounting apparatus of claim 1, wherein the bracket further comprises a second sidewall parallel to the first sidewall, the second sidewall defines a second slide slot, the other one of the side plates of the mounting member forms a second post slidable in the second slide slot of the second side plate.

3. The mounting apparatus of claim 1, wherein a raised portion is formed on the outer surface of the side plate of the mounting member and aligned with the first post of the mounting member, the raised portion is slidable in the first slide slot of the bracket.

4. The mounting apparatus of claim 1, wherein the mounting member is made of elastic material.

5. The mounting apparatus of claim 1, wherein the mounting member is substantially U-shaped.

6. The mounting apparatus of claim 1, wherein a plurality of positioning portions with an L-shaped cross section are formed on an outer surface of the first sidewall of the bracket, the locking member comprises a substantially rectangular-shaped main body, a plurality of positioning pieces extend outward from opposite sides of the main body of the locking member and are positioned under corresponding positioning portions of the first sidewall.

7. The mounting apparatus of claim 6, wherein the first sidewall of the bracket forms a locking piece above the positioning portions, a hooking portion is formed on a top portion of the main body of the locking member, two ends of the resilient member are locked to the hooking portion of the locking member and the locking piece of the first sidewall.

8. The mounting apparatus of claim 6, wherein a handle extends from a bottom of the main body.

9. The mounting apparatus of claim 6, wherein a horizontal slot is defined in an inner surface of the main body of the locking member, a protrusion is formed in the slot, the inclined surface and the stop surface are formed at opposite sides of the protrusion.

* * * * *